(12) United States Patent
Yoshida

(10) Patent No.: US 6,437,426 B1
(45) Date of Patent: Aug. 20, 2002

(54) SEMICONDUCTOR INTEGRATED CIRCUIT HAVING AN IMPROVED GROUNDING STRUCTURE

(75) Inventor: Shiro Yoshida, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/492,363

(22) Filed: Jan. 27, 2000

(30) Foreign Application Priority Data

Jan. 27, 1999 (JP) .......................................... 11-017881

(51) Int. Cl.[7] .............................................. H01L 29/40
(52) U.S. Cl. ........................ 257/664; 257/691; 257/532
(58) Field of Search ................................. 257/664, 532, 257/723, 724, 686, 303, 691, 666

(56) References Cited

U.S. PATENT DOCUMENTS

| 4,705,917 A | * | 11/1987 | Gates et al. |
| 5,237,204 A | * | 8/1993 | Val |
| 5,283,717 A | * | 2/1994 | Hundt |
| 5,371,403 A | * | 12/1994 | Huang et al. |
| 5,444,298 A | * | 8/1995 | Schutz |
| 5,789,807 A | * | 8/1998 | Correale, Jr. |
| 6,222,246 B1 | * | 4/2001 | Mak et al. |

FOREIGN PATENT DOCUMENTS

| JP | 02-226756 | 9/1990 |
| JP | 4-262567 | 9/1992 |
| JP | 06-310662 | 11/1994 |

* cited by examiner

*Primary Examiner*—Sheila V. Clark
(74) *Attorney, Agent, or Firm*—Sughrue Mion, PLLC

(57) ABSTRACT

In a semiconductor integrated circuit, a ground plane conductor 3 is formed in a substrate 9 to oppose to a conducting line 2 formed on the substrate, so as to form a microstrip line. A decoupling capacitor 1 is provided on the substrate 9 and is electrically connected between the conducting line 2 and the ground plane conductor 3 so as to bypass a high frequency current component flowing through the conducting line to the ground plane conductor. Thus, the impedance of the conducting line 2 is stabilized, and a path of a feedback current of a high frequency current component flowing through the conducting line 2 is ensured by the ground plane conductor 3, so that a current loop is minimized, resulting in minimized electromagnetic noises radiated from the current loop.

12 Claims, 4 Drawing Sheets

SEMICONDUCTOR INTEGRATED CIRCUIT HAVING AN IMPROVED GROUNDING STRUCTURE

BACKGROUND OF THE INVENTION

The present invention relates to a semiconductor integrated circuit, and more specifically to a semiconductor integrated circuit including an improved structure of a ground line, a ground plane, or a grounded conductor and an internally provided decoupling capacitor.

In the prior art, semiconductor integrated circuits are developed to increase an integration density while paying attention to a required performance and operation. However, the attention to a ground layer is tenuous, and the prior art semiconductor integrated circuits did not have the ground layer.

Referring to FIG. 1, there is shown a partially broken, diagrammatic perspective view of a prior art semiconductor integrated circuit. As shown in FIG. 1, a conducting line 2 is formed on a principal surface of a substrate 9. In this structure, a problem is almost never recognized in connection with electromagnetic noises radiated from a semiconductor device. As a result, at present, electromagnetic noises radiated from various electronic instruments, attributable to semiconductor devices mounted on a printed circuit included in the electronic instrument, have become a problem attracting attention of people. This problem of electromagnetic noises is expected to become more serious with an increase in an operation speed and in the integration density of the semiconductor device.

As mentioned above, since the prior art semiconductor integrated circuit has no ground layer, a line impedance of an internal (ungrounded) conducting line such as a signal line and a power supply line is not stable, with the result that there occurs a noise attributable to waveform disturbance caused by a line reflection.

Furthermore, since the prior art semiconductor integrated circuit has no ground layer, a path of a feedback current of a current flowing in the semiconductor device is indefinite and therefore complicated, with the result that a large loop is constituted of the current flowing in the semiconductor device and its feedback current. This current loop functions as a loop antenna, which causes the electromagnetic radiation.

Moreover, in the prior art semiconductor integrated circuit, since no decoupling capacitor is internally provided in a power supply line, a spurious high frequency power supply current superposed on the power supply line is flowed out through a lead frame to a circuit external to the semiconductor integrated circuit. This is one of major causes of electromagnetic noises radiated from the electronic instrument.

Japanese Patent Application Pre-examination Publication No. JP-A-04-262567 (an English abstract of which is available and the content of the English abstract is also incorporated by reference in its entirety into this application) proposes a semiconductor device having a power supply line and a ground line. Referring to FIG. 2, there is shown a diagrammatic partial sectional view of the semiconductor device proposed in JP-A-04-262567. JP-A-04-262567 describes that, as shown in FIG. 2, a conducting line 2 which is a power supplying line and a ground line 4 are formed in a substrate 9, so that a parasite capacitance 30 formed between the conducting line 2 and the ground line 4, is caused to function as a bypass capacitor. However, the magnitude of the parasite capacitance mentioned in JP-A-04-262567 is too small, and therefore, a satisfactory effect of the bypass capacitor cannot be so expected.

Accordingly, it is an object of the present invention to provide a semiconductor integrated circuit which has overcome the above mentioned problems of the prior art.

Another object of the present invention is to provide a semiconductor integrated circuit capable of minimizing a noise generation from a circuit which is a major noise source in the semiconductor integrated circuit, in order to prevent the spurious electromagnetic noises radiated from the electronic instruments.

The above and other objects of the present invention are achieved in accordance with the present invention by a semiconductor integrated circuit comprising a microstrip line formed of an ungrounded conducting line formed at a substrate and a ground plane conductor formed at the substrate to oppose to the conducting line separately from the conducting line, and a decoupling capacitor provided at the substrate and electrically connected between the conducting line and the ground plane conductor so as to bypass a high frequency current component flowing through the conducting line to the ground plane conductor.

For example, the conducting line is formed on a principal surface of the substrate, and the decoupling capacitor is provided at the principal surface of the substrate. One end of the decoupling capacitor is electrically connected to the conducting line formed on the principal surface of the substrate, and the other end of the decoupling capacitor is electrically connected to the ground plane conductor through a via hole formed in the substrate.

In addition, the decoupling capacitor can be constituted of a chip capacitor mounted on the substrate, or a gate insulator film capacitance which is formed in a MOS transistor formed at the substrate, or alternatively, a PN junction capacitance of a PN junction formed in the substrate.

In a preferred embodiment of the semiconductor integrated circuit, the conducting line is formed of a power supply conductor, and a conductive pad is formed on the principal surface of the substrate for electrically connecting the power supply conductor to an external terminal. In this case, the one end of the decoupling capacitor is electrically connected to the conductive pad on the principal surface of the substrate.

In brief, the semiconductor integrated circuit in accordance with the present invention is characterized in that the decoupling capacitor for bypassing a high frequency current component flowing in the ungrounded conducting line of the microstrip line, to the ground, is provided at the substrate independently of a parasite capacitance. In addition, the ground plane conductor which was not considered in the prior art semiconductor integrated circuit, is positively formed at the substrate to oppose to the conducting line (which can be a power supply line or a signal line) separately from the conducting line. With this arrangement, a feedback path of the current, namely, a loop current area, can be minimized, so that the electromagnetic radiation noises can be effectively suppressed.

Here, if the ground plane conductor is formed to oppose to the ungrounded conducting line so as to constitute the microstrip line, another problem may be encountered in which a power consumption of the semiconductor integrated circuit is increased. In this case, the ground plane conductor is partially formed in a limited region, for example, to oppose to only a critical line (such as a clock line or a bus line), by counterpoising the overall power consumption with the advantage of the ground plane conductor.

Furthermore, if the decoupling capacitor, not the parasite capacitance, is positively connected between the power supply line and the ground plane conductor, a high frequency current component flowing through the power supply line can be effectively bypassed to the ground. In this case, the large the capacitance of the decoupling capacitor is, the characteristic impedance of the line can be reduced, and also, the power consumption can be lowered.

As mentioned above, if the ground plane conductor is formed to oppose to the conducting line separately from the conducting line in the semiconductor integrated circuit, the microstrip line is constituted. The characteristic impedance "Z" of the microstrip line is stable, and can be expressed by the following equation (1) under the assumption having no edge effect:

$$Z=\{2\times(\mu\times\in)^{1/2}\}/C\omega \qquad (1)$$

where $\mu$ is permeability of dielectric material $\in$ is permittivity of dielectric material C is capacitance between the conducting line and the ground plane conductor.

If the microstrip line is constituted as mentioned above, the impedance is stabilized, so that waveform disturbance caused by a line reflection can be suppressed, and therefore, a noise attributable to the waveform disturbance can be minimized.

Furthermore, since the ground plane conductor is formed to oppose to the conducting line separately from the conducting line in the semiconductor integrated circuit so as to constitute the microstrip line, a feedback current of a high frequency current component flowing through the conducting line flows through the ground plane conductor directly under the conducting line, in a direction opposite to that of the current component flowing through the conducting line, so that a current loop is constituted. The following equation (2) expresses a remote electric field "E" in a differential mode radiation caused by the looped current.

$$E=131.6\times 10^{31\ 16}\ (f2A\ I)\ (1/r)\ \sin\theta(V/m) \qquad (2)$$

where f is frequency (Hz)

A is an area of current loop (m$^2$)

I is current (A)

r is free space distance

As seen from the equation (2), in order to suppress the electromagnetic radiation noises, it is necessary to minimize the area of current loop. Since the ground plane conductor is formed so as to constitute the microstrip line, the area of current loop is minimized, so that the remote electric field strength can be made small. In the case of having no ground, the feedback current of the current flowing through the conducting line takes a complicated path, so that a large current loop is constituted, resulting in a large remote electric field strength.

In the preferred embodiment, if the decoupling capacitor is located on and connected to the pad of the power supply line for electrically connecting the power supply line to an external terminal (such as a lead frame), the spurious high frequency power supply current flowing through the power supply line can be bypassed to the ground without flowing out to a circuit external to the semiconductor integrated circuit. If the spurious high frequency power supply current flows out to the circuit external to the semiconductor integrated circuit, the spurious high frequency power supply current is spread to a complicated path in a printed circuit board, resulting in a cause of the electromagnetic radiation noises. This problem can be prevented in the preferred embodiment of the semiconductor integrated circuit in accordance with the present invention, since the spurious high frequency power supply current flowing through the power supply line is effectively suppressed within the semiconductor integrated circuit.

The above and other objects, features and advantages of the present invention will be apparent from the following description of preferred embodiments of the invention with reference to the accompanying drawings.

DETAILED DESCRIPTION OF THE INVENTION

Now, embodiments of the semiconductor integrated circuit in accordance with the present invention will be described with reference to the drawings, in which the same elements are given the same Reference Numbers throughout all the drawings.

Figure 3:
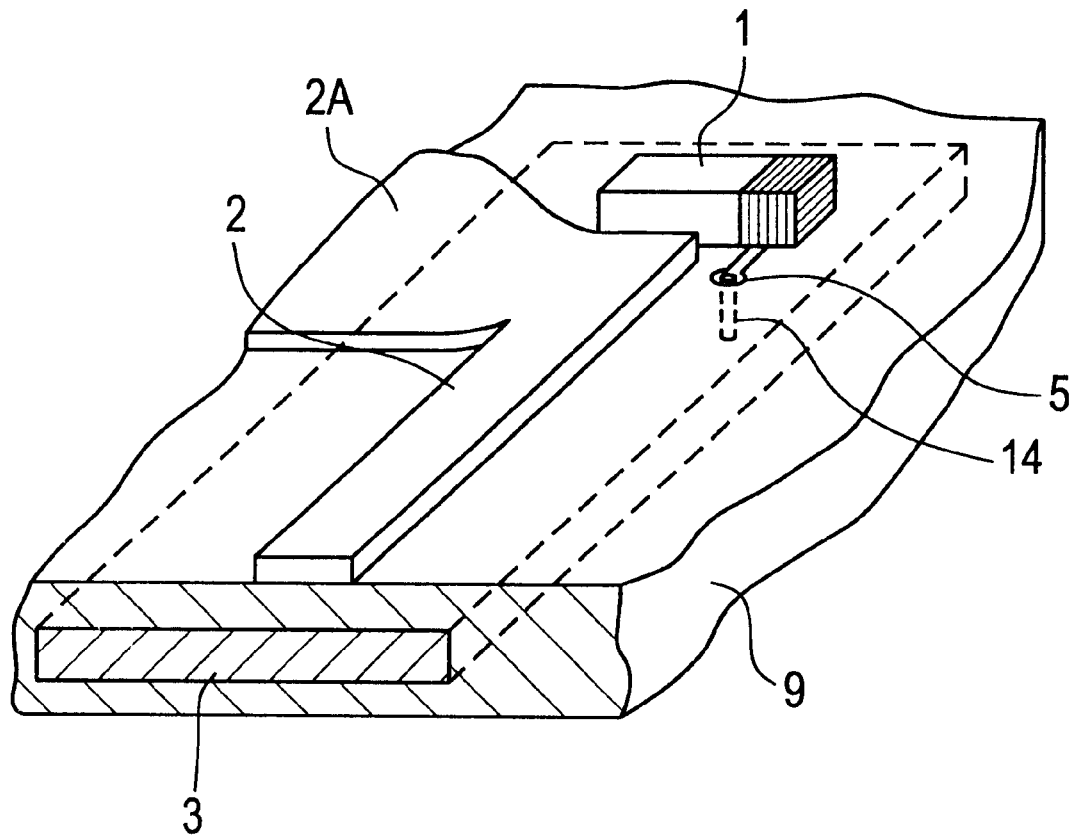
FIG. 3 is a partially broken, diagrammatic perspective view of one embodiment of the semiconductor integrated circuit in accordance with the present invention.

Referring to FIG. 3, there is shown a partially broken, diagrammatic perspective view of one embodiment of the semiconductor integrated circuit in accordance with the present invention.

In the shown semiconductor integrated circuit, a ground plane conductor 3 is formed and embedded in a silicon substrate 9 to oppose to a conducting line 2 which is formed on a principal surface of the substrate 9 and which was in a floating condition in the prior art semiconductor integrated circuit because no ground plane conductor was formed. Thus, a microstrip line is constituted by the conducting line 2 and the ground plane conductor 3 separated by the substrate 9 which can be considered to be dielectric.

Furthermore, in order to realize a maximum noise suppressing effect, a decoupling capacitor 1 is located on the substrate 9 at a pad portion 2A of the conducting line 2 which is connected to a not-shown external terminal (such as a lead frame), so that one end of the decoupling capacitor 1 is electrically connected to the pad portion 2A of the conducting line 2, and the other end of the decoupling capacitor 1 is electrically connected to the ground plane conductor 3 through a contact 5 and a via hole 14 formed in the substrate 9.

With this arrangement, a spurious high frequency power supply current flowing through the conducting line 2 can be bypassed to the ground plane conductor 3 without flowing out to a circuit external to the semiconductor integrated circuit. A typical example of the conducting line 2 is a power supply line, but the conducting line 2 can be considered to be a clock signal line or a bus line. In the shown embodiment, the conducting line 2 is formed on the principal surface of the substrate 9, but can be embedded in the inside of the substrate 9, similarly to the ground plane conductor 3 shown in FIG. 3.

Figure 4:
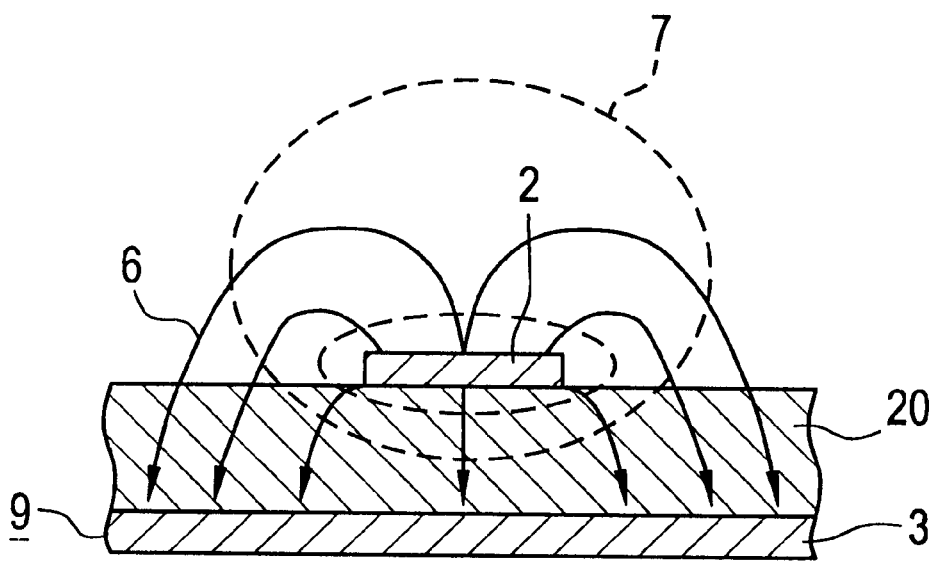
FIG. 4 illustrates an electromagnetic field in a microstrip line 5 structure.

Referring to FIG. 4, an electromagnetic field in a microstrip line structure is illustrated. A main transmission mode is a TEM mode (transverse electromagnetic mode). Therefore, the electric field 6 is the same as that generated when a DC current is supplied to the conducting line 2 opposing to the ground plane conductor 3, and accordingly, the distribution of electric field 6 becomes as shown by the solid line in FIG. 4. On the other hand, the distribution of magnetic field 7 becomes as shown by the dotted line in FIG. 4, perpendicular to the distribution of electric field 6. In FIG. 4, the reference number 20 indicates a dielectric material which is a silicon of the substrate 9.

Figure 5:
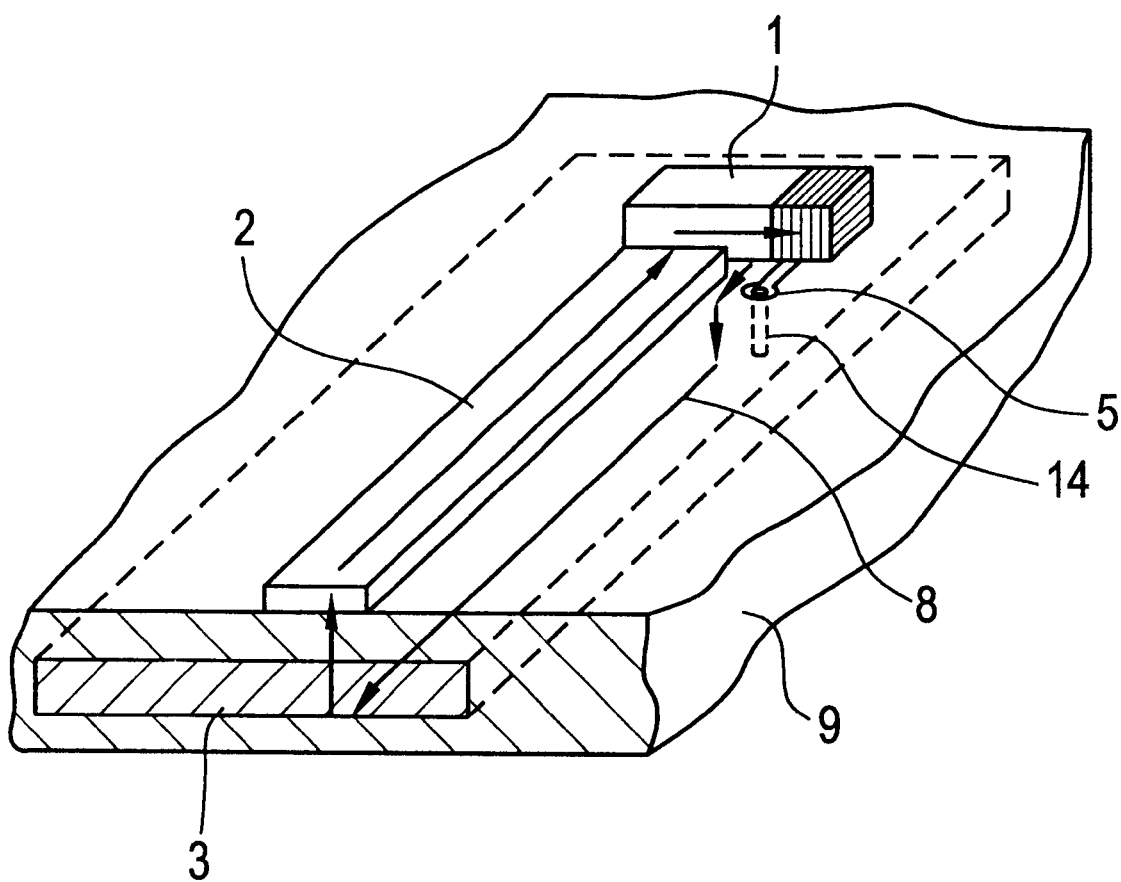
FIG. 5 is a partially broken, diagrammatic perspective view for illustrating the path of the feedback current in the semiconductor integrated circuit in accordance with the present invention.

Referring to FIG. 5, the path of the feedback current in the semiconductor integrated circuit shown in FIG. 3 is illustrated. A current loop 8 is formed as shown in FIG. 5. Namely, a high frequency current component flowing through the conducting line 2 flows through the decoupling capacitor 1, the contact 5 and the via hole 14 into the ground plane conductor 3, and then, flows through the ground plane conductor 3 directly under the conducting line 2, in a direction opposite to that of the current component flowing through the conducting line 2, so that the current loop 8 is constituted.

Figure 1:
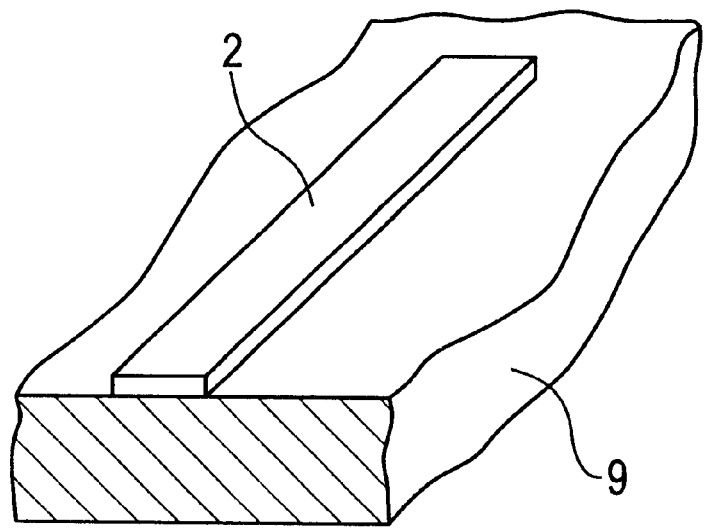
FIG. 1 is a partially broken, diagrammatic perspective view of a prior art semiconductor integrated circuit.
Figure 2:
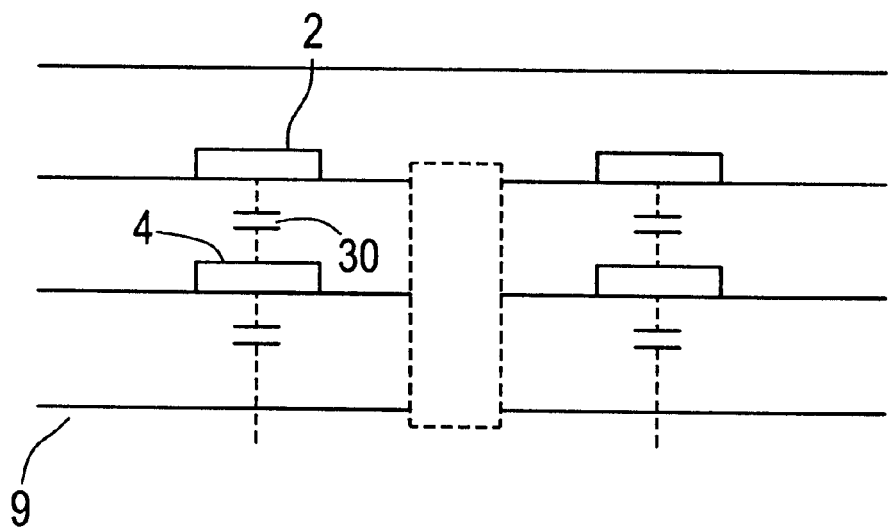
FIG. 2 is a diagrammatic partial sectional view of a prior art semiconductor device.

On the other hand, in the semiconductor integrated circuit shown in FIG. 1 having no ground plane conductor, a path of a feedback current of a current flowing through a conducting line in the semiconductor device is indefinite and therefore complicated, with the result that a large loop is constituted of the current flowing in the semiconductor device and its feedback current. The loop functions as a loop antenna, which causes the electromagnetic radiation. This problem is minimized in the shown embodiment.

Figure 6A:
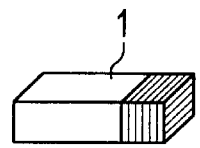
FIGS. 6A to 6C illustrate various decoupling capacitors.
Figure 6B:
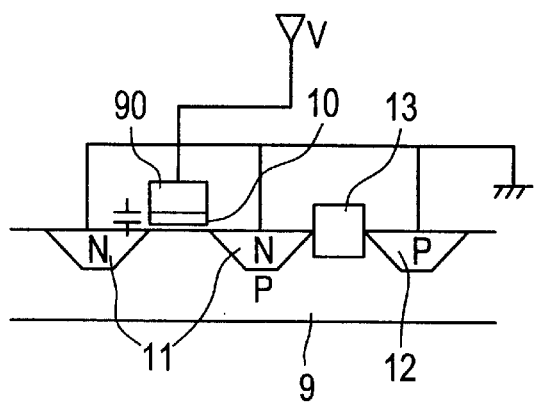
Figure 6C:
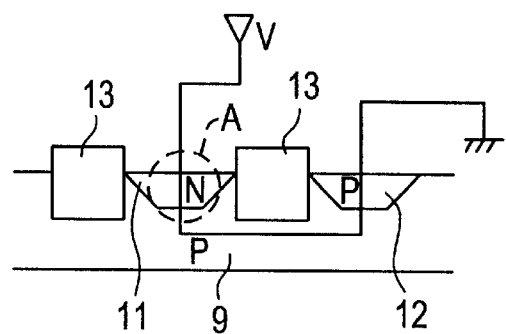

Referring to FIGS. 6A to 6C, various decoupling capacitors are illustrated.

The decoupling capacitor 1 can be constituted of a chip capacitor as shown in FIG. 6A. The chip capacitor is mounted on the principal surface of the substrate 9 as shown in FIG. 3. When the chip capacitor has a polarity as in the case of an electrolytic capacitor, the chip capacitor is mounted on the substrate 9 in such a manner that a negative side terminal of the chip capacitor is connected to the ground plane conductor 3.

If the chip capacitor cannot be used because of a restriction in for locating the chip capacitor, the decoupling capacitor can be constituted of a capacitance formed by a gate insulator film which is formed in a MOS transistor formed at the substrate 9 shown in FIG. 6B, or a PN junction capacitance of a PN junction formed in the substrate 9 shown in FIG. 6C.

In the example shown in FIG. 6B, a field oxide film 13 is formed on the principal surface of the substrate 9 of a P-type conductivity, to define a plurality of active regions, and a pair of N-type source/drain regions 11 are formed, separately from each other, in one active region surrounded by the field oxide film 13. A gate oxide film 10 of $SiO_2$ is formed on the principal surface of the substrate 9 between the N-type source/drain regions 11, and a gate electrode 90 is formed on the gate oxide film 10. Thus, an N-channel MOS transistor is formed. A P-type source/drain region 12 is formed in another active region surrounded by the field oxide film 13, for forming a P-channel MOS transistor.

With this arrangement, the gate electrode 90 is connected to the conducting line 2 for a power supply voltage V, and the source/drain regions 11 and 12 are connected to the ground plane conductor 3, so that a capacitance is formed between the gate electrode 90 and the P-type substrate 9 separated by the gate oxide film 10. Thus, the decoupling capacitor is constituted of the capacitance formed between the gate electrode 90 and the P-type substrate 9 separated by the gate oxide film 10.

Figure 6D:
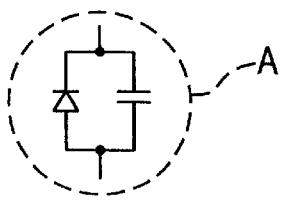
FIG. 6D is an equivalent circuit of the decoupling capacitor shown in FIG. 5C.

In the example shown in FIG. 6C, the N-type source/drain region 11 in the P-type substrate 9 is connected to the conducting line 2 for the power supply voltage V, and the P-type source/drain region 12 in the P-type substrate 9 is connected to the ground plane conductor 3, so that a PN junction between the N-type source/drain region 11 and the P-type substrate 9 is reverse-biased. Thus, the decoupling capacitor is constituted of the reverse-biased PN junction, as could be see from FIG. 6D which is an equivalent circuit of the portion surrounded by a dotted circuit in FIG. 6C.

In this connection, it would be apparent to persons skilled in the be that the decoupling capacitor is in no way limited to the examples shown in FIGS. 6A to 6C.

As mentioned above, since the ground plane conductor is formed directly under the conducting line to oppose to the conducting line separately from the conducting line in the semiconductor integrated circuit so as to constitute the microstrip line, it is possible to minimize the area of a current loop which is constituted of a high frequency current component flowing through the conducting line and a feedback current of the high frequency current component. Thus, the electromagnetic noises radiated from the current loop are minimized.

In addition, since the ground plane conductor is formed to oppose to the power supply line separately from the power supply line, and since the decoupling capacitor is connected between the ground plane conductor and the pad of the power supply line for electrically connecting the power supply line to an external terminal, the spurious high frequency power supply current flowing through the power supply line can be bypassed to the ground without flowing out to a circuit external to the semiconductor integrated circuit. Since the spurious high frequency power supply current superposed on the power supply line is bypassed to the ground without flowing out to a circuit external to the semiconductor integrated circuit, it is possible to minimize the electromagnetic radiation noises generated from the printed circuit board on which the semiconductor integrated circuit is mounted.

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor integrated circuit comprising a microstrip line formed of a conducting line formed on or in a substrate and a ground plane conductor formed in said substrate to oppose to said conducting line separately from said conducting line, and a decoupling capacitor provided on said substrate and electrically connected between said conducting line and said ground plane conductor so as to bypass a high frequency current component flowing through said conducting line to said ground plane conductor;

wherein said decoupling capacitor comprises a chip capacitor mounted on said substrate.

2. A semiconductor integrated circuit comprising a microstrip line formed of a conducting line formed on or in a substrate and a ground plane conductor formed in said substrate to oppose to said conducting line separately from said conducting line, and a decoupling capacitor provided on said substrate and electrically connected between said conducting line and said ground plane conductor so as to bypass a high frequency current component flowing through said conducting line to said ground plane conductor;

wherein said decoupling capacitor comprises a gate insulator film capacitance which is formed in a MOS transistor formed on said substrate.

3. A semiconductor integrated circuit comprising a microstrip line formed of a conducting line formed on or in a substrate and a ground plane conductor formed in said substrate to oppose to said conducting line separately from said conducting line, and a decoupling capacitor provided on or in said substrate and electrically connected between said conducting line and said ground plane conductor so as to bypass a high frequency current component flowing through said conducting line to said ground plane conductor;

wherein said conducting line is formed of a power supply conductor, and a conductive pad is formed on said principal surface of said substrate for electrically connecting said power supply conductor to an external terminal, said one end of said decoupling capacitor being electrically connected to said conductive pad on said principal surface of said substrate.

4. A semiconductor integrated circuit claimed in claim 1 wherein said conducting line is formed on a principal surface of said substrate, and said decoupling capacitor is provided on or in said principal surface of said substrate, one end of said decoupling capacitor being electrically connected to said conducting line formed on said principal surface of said substrate, and the other end of said decoupling capacitor being electrically connected to said ground plane conductor through a via hole formed in said substrate.

5. A semiconductor integrated circuit claimed in claim 4 wherein said conducting line is formed of a power supply conductor, and a conductive pad is formed on said principal surface of said substrate for electrically connecting said power supply conductor to an external terminal, said one end of said decoupling capacitor being electrically connected to said conductive pad on said principal surface of said substrate.

6. A semiconductor integrated circuit claimed in claim 2 wherein said conducting line is formed on a principal surface of said substrate, and said decoupling capacitor is provided on or in said principal surface of said substrate, one end of said decoupling capacitor being electrically connected to said conducting line formed on said principal surface of said substrate, and the other end of said decoupling capacitor being electrically connected to said ground plane conductor through a via hole formed in said substrate.

7. A semiconductor integrated circuit claimed in claim 3 wherein said conducting line is formed on a principal surface of said substrate, and said decoupling capacitor is provided on or in said principal surface of said substrate, one end of said decoupling capacitor being electrically connected to said conducting line formed on said principal surface of said substrate, and the other end of said decoupling capacitor being electrically connected to said ground plane conductor through a via hole formed in said substrate.

8. A semiconductor integrated circuit claimed in claim 6 wherein said conducting line is formed of a power supply conductor, and a conductive pad is formed on said principal surface of said substrate for electrically connecting said power supply conductor to an external terminal, said one end of said decoupling capacitor being electrically connected to said conductive pad on said principal surface of said substrate.

9. A semiconductor integrated circuit claimed in claim 7 wherein said decoupling capacitor comprises a PN junction capacitance of a PN junction formed in said substrate.

10. A semiconductor integrated circuit claimed in claim 1 wherein said conducting line is formed of a power supply conductor, and a conductive pad is formed on said principal surface of said substrate for electrically connecting said power supply conductor to an external terminal, said one end of said decoupling capacitor being electrically connected to said conductive pad on said principal surface of said substrate.

11. A semiconductor integrated circuit claimed in claim 2 wherein said conducting line is formed of a power supply conductor, and a conductive pad is formed on said principal surface of said substrate for electrically connecting said power supply conductor to an external terminal, said one end of said decoupling capacitor being electrically connected to said conductive pad on said principal surface of said substrate.

12. A semiconductor integrated circuit claimed in claim 3 wherein said decoupling capacitor comprises a PN junction capacitance of a PN junction formed in said substrate.

* * * * *